United States Patent
Tomita

(10) Patent No.: US 8,076,986 B2
(45) Date of Patent: Dec. 13, 2011

(54) SWITCHING CAPACITOR GENERATION CIRCUIT

(75) Inventor: Kazuhiro Tomita, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/562,118

(22) Filed: Sep. 17, 2009

(65) Prior Publication Data

US 2010/0007427 A1    Jan. 14, 2010

Related U.S. Application Data

(63) Continuation of application No. PCT/JP2007/055773, filed on Mar. 21, 2007.

(51) Int. Cl.
*H03B 5/12* (2006.01)
*G06F 7/64* (2006.01)

(52) U.S. Cl. ..................................... 331/177 V; 337/337

(58) Field of Classification Search .................. 331/167, 331/177 V, 117 FE; 327/337, 392
See application file for complete search history.

(56) References Cited

U.S. PATENT DOCUMENTS

| 6,734,713 B1 * | 5/2004 | Magoon et al. ............... 327/382 |
| 6,815,996 B1 * | 11/2004 | Hsiao ............................. 327/337 |
| 2004/0080374 A1 | 4/2004 | Muramatsu |
| 2008/0129398 A1 * | 6/2008 | Sun et al. ................ 331/117 FE |

FOREIGN PATENT DOCUMENTS

| JP | 63-103505 A | 5/1988 |
| JP | 08-195667 A | 7/1996 |
| JP | 11-176163 A | 7/1999 |
| JP | 2004-140471 A | 5/2004 |

* cited by examiner

*Primary Examiner* — Joseph Chang
(74) *Attorney, Agent, or Firm* — Arent Fox LLP

(57) ABSTRACT

A switching capacitor generation circuit which reduces the on-resistance and parasitic capacitance of a switch element and improves the operation properties of the switch element. The switching capacitor generation circuit, which has first and second output terminals, includes a first capacitor coupled to the first output terminal, a second capacitor coupled to the second output terminal, and a single switch element coupled between the first and the second capacitors.

20 Claims, 8 Drawing Sheets

SWITCHING CAPACITOR GENERATION CIRCUIT

CROSS-REFERENCE TO RELATED APPLICATION

This application is a Continuation Application of International Application No. PCT/JP2007/055773, having an international filing date of Mar. 21, 2007, the disclosure of each of which is hereby incorporated in its entirety by reference.

FIELD

The present invention relates to a switching capacitor generation circuit used to adjust the oscillation frequency of an oscillator and the cutoff frequency of a filter.

BACKGROUND

There are oscillators and filters that include a switching capacitor generation circuit to select a capacitor that is coupled to the oscillator or filter with a switching element and thereby adjust the oscillation frequency or cutoff frequency. The switching capacitor generation circuit selects whether or not to couple the capacitor via a switching element, which is formed by a MOS transistor. The operation properties of such a switching element must be improved.

FIG. 13 shows a prior art voltage-controlled oscillator (hereinafter referred to as VCO) coupled to capacitor arrays 1a and 1b, which include switching elements. In the VCO, an oscillator 2 includes two inverter circuits, the input/output terminals of which are coupled to each other. An inductance 3 is coupled between output terminals OUT1 and OUT2 of the inverter circuits, and variable capacitors 4a and 4b, which are coupled in series, are coupled between the two terminals of the inductance 3. The inductance 3 and the variable capacitors 4a and 4b form an LC oscillation circuit.

When a control voltage VT is supplied to the node between the variable capacitors 4a and 4b, the oscillator 2 outputs an output signal that oscillates at a frequency that is based on the control voltage VT from the output terminals OUT1 and OUT2.

The capacitor arrays 1a and 1b, which adjust the oscillation frequency of the oscillator 2, are coupled to the output terminals OUT1 and OUT2, respectively. Since the capacitor arrays 1a and 1b have the same configuration, only the capacitor array 1a will be described here.

The capacitor array 1a includes a plurality of switching capacitor generation circuits (three in FIG. 13), which are coupled in parallel, between the output terminal OUT1 and a power supply Vss, which is a low potential power supply. The switching capacitor generation circuits each include a capacitor (C1, C2, C4 in the drawing and a switch element SW, which is formed by an N-channel MOS transistor and coupled in series to the capacitor. The capacitance values of the capacitors C1, C2, C4, . . . is weighed so as to be 1:2:4 . . . .

Control signals V1, V2, and V4 respectively provided to the switching elements SW open and close the switch elements SW. The capacitor coupled to the switching element SW switched to a conductive state acts on the output terminal OUT1. In the capacitor arrays 1a and 1b, the switch elements SW are respectively controlled by the control signals V1, V2, and V4 so that the capacitance values coupled to the output terminals OUT1 and OUT2 become the same.

In the VCO, the frequency of the output signal output from the output terminals OUT1 and OUT2 is adjusted by adjusting the capacitance value of the capacitor arrays 1a and 1b, which are coupled to the output terminals OUT1 and OUT2, with the control signals V1, V2, and V4.

Such a VCO is used, for example, in a PLL circuit, for example. The adjustment of the capacitor arrays 1a and 1b roughly adjusts the frequency of the output signal. In this state, the control voltage VT generated by a PLL loop further adjusts the frequency of the output signal.

The VCO oscillates at a high frequency in the switching capacitor generation circuit used in the capacitor array 1a, 1b. Thus, the conditions described below are necessary.

First, when the switch element SW is in a conductive state. It is desirable that the on-resistance of the switch element SW be decreased. If the on-resistance is decreased, the capacitors coupled to the output terminals OUT1 and OUT2 of the oscillator 2 are efficiently operated thereby improving the quality factor. Thus, the N-channel MOS transistor forming the switch element SW must have a large gate width and a short gate length.

Further, when the switch element SW is in a non-conductive state, it is desirable that a parasitic capacitor Cp of the switch element SW shown in FIG. 14 be reduced. When the parasitic capacitor Cp of the switch element SW becomes large, the change in the capacitance value that acts on the output terminal becomes small when the switch element SW is in a conductive state and a non-conductive state. When reducing the size of the parasitic capacitor Cp, the N-channel MOS transistor forming the switch element SW must have a small gate width and a long gate length to reduce the size of the parasitic capacitor generated between the drain of the N-channel MOS transistor and the P-well.

Accordingly, the gate width must be increased to improve the quality factor when the switch element SW is in a conductive state, and the gate width must be decreased to reduce the size of the parasitic capacitor Cp when the switch element SW is in a non-conductive state. It is difficult to satisfy both of these conditions at the same time.

Patent document 1 discloses a sense amplifier circuit similar to the circuit configuration of the oscillator 2. However, there is not disclosure related to the quality factor and parasitic capacitance of the capacitor array. Patent document 1: Japanese Laid-Open Patent Publication No. 11-176163

SUMMARY

The present invention provides a switching capacitor generation circuit capable of reducing the on-resistance and the parasitic capacitance of a switch element to improve the operation properties of the switch element.

A first aspect of the present invention provides a switching capacitor generation circuit. The switching capacitor generation circuit, which has first and second output terminals, includes a first capacitor coupled to the first output terminal, a second capacitor coupled to the second output terminal, and a single switch element coupled between the first and the second capacitors.

With the present invention, in a switching capacitor generation circuit that uses a switch element to select a capacitor connected to, for example, an LC resonance circuit or LC oscillation circuit, the on-resistance and parasitic capacitance of a switch element are reduced. This improves the operation properties of the switch element.

DESCRIPTION OF EMBODIMENTS

First Embodiment

Figure 1:
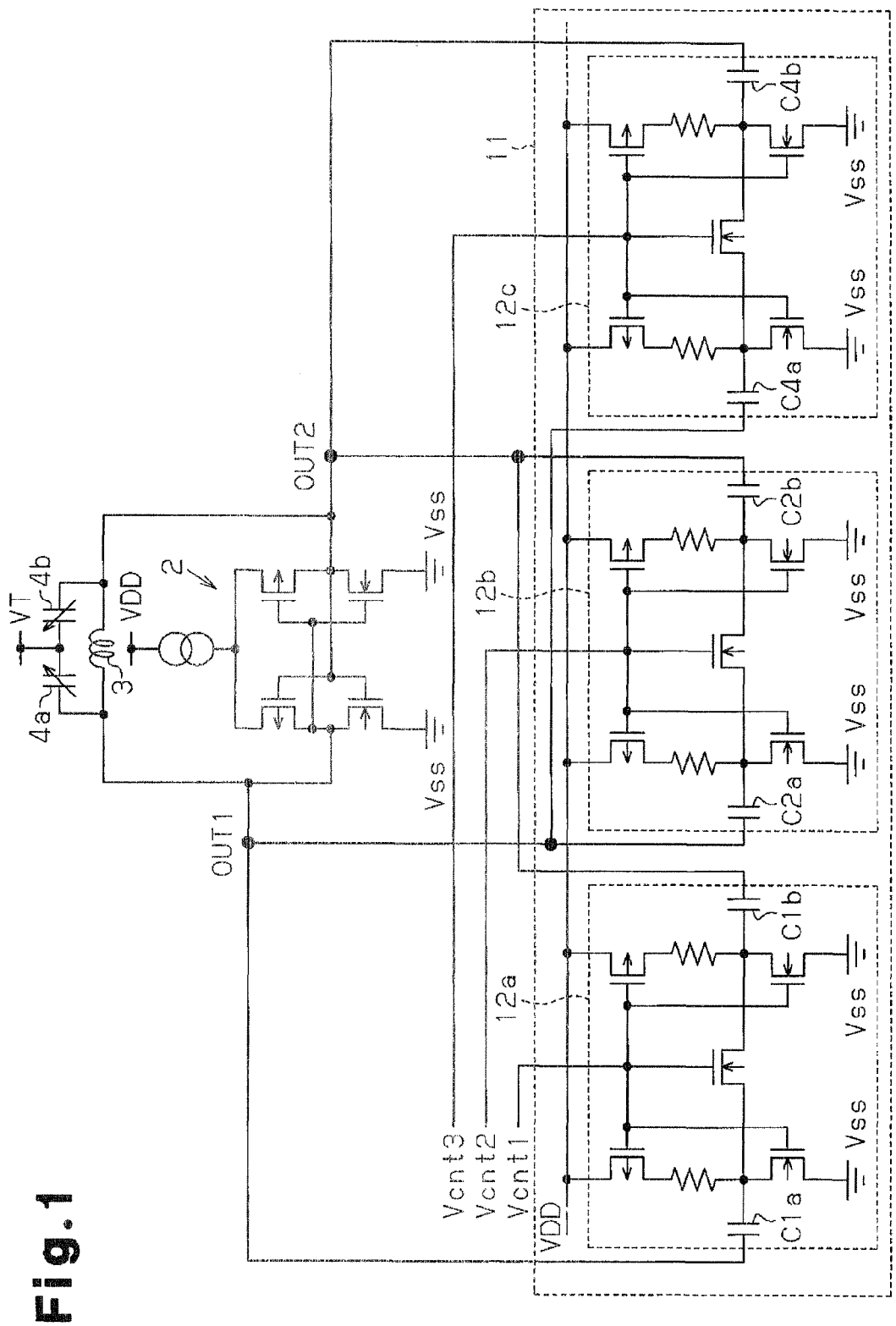
FIG. 1 is a circuit diagram showing a VCO in a first embodiment.

FIG. 1 shows a first embodiment of a VCO according to the present invention. Parts that are the same as the prior art example are illustrated with the same reference numbers.

The oscillator 2 of the VCO has the same configuration as the prior art example. A capacitor array 11, which adjusts the frequency of the output signals output from output terminals OUT1 and OUT2 of the oscillator 2, is coupled to the output terminals OUT1 and OUT2. The capacitor array 11 includes a plurality of switching capacitor generation circuits 12a to 12c. The switching capacitor generation circuits 12a to 12c are each coupled to the output terminals OUT1 and OUT2.

Each of the switching capacitor generation circuits 12a to 12c has the same configuration except for the capacitance value. Thus, only the configuration of the switching capacitor generation circuit 12a will be described here.

Figure 2:
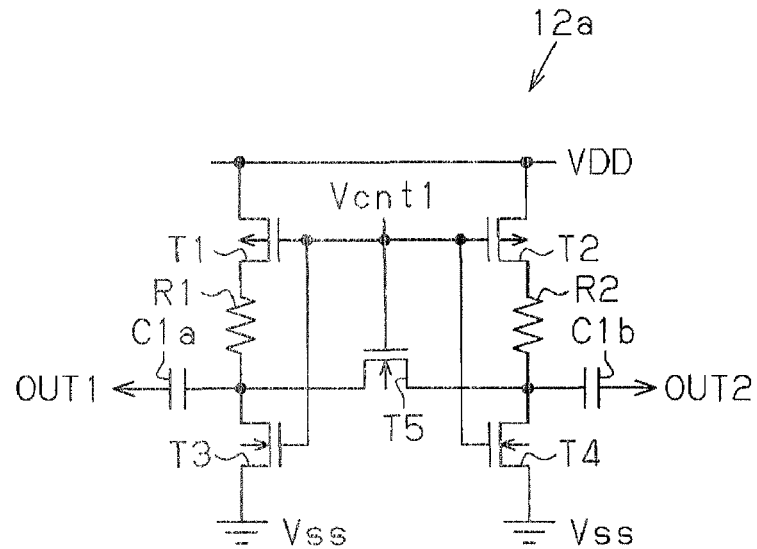
FIG. 2 is a circuit diagram showing a switching capacitor generation circuit of FIG. 1.

As shown in FIG. 2, in the switching capacitor generation circuit 12a, the sources of the P-channel MOS transistors T1 and T2 are coupled to a high potential power supply VDD. The drain of the transistor T1 is coupled to the drain of an N-channel MOS transistor T3 via a resistor R1, and the source of the transistor T3 is coupled to a power supply Vss. The drain of the transistor T2 is coupled to the drain of an N-channel MOS transistor T4 via a resistor R2, and the source of the transistor T4 is coupled to the power supply Vss.

The transistors T1 and T2 are set to have a narrow gate width and a long gate length in order to obtain a sufficiently high on-resistance.

To suppress the formation of a parasitic capacitance, the resistors R1 and R2 are formed from polysilicon and set to have, for example, a wiring width of a minimum value. The resistance values of the resistors R1 and R2 are set to resistance values sufficiently higher than the on-resistance values of the transistors T1 and T2.

An N-channel MOS transistor T5 is coupled between the drains of the transistors T3 and T4. A control signal Vcnt1 is provided to the gates of the transistors T1 to T5.

The transistor T5 is set with a large gate width and the shortest gate length to reduce the on-resistance. The transistors T3 and T4 are set with the narrowest gate width and the shortest gate length to reduce the parasitic capacitance and increase the on-resistance.

The drain of the transistor T3 is coupled to the output terminal OUT1 via a capacitor C1a, and the drain of the transistor T4 is coupled to the output terminal OUT2 via a capacitor C1b. The capacitors C1a and C1b have the same capacitance value.

The switching capacitor generation circuit 12b (FIG. 1) has the same configuration as the switching capacitor generation circuit 12a except for the capacitance values of the capacitors C2a and C2b. The capacitance values of the capacitors C2a and C2b are set to be two times greater than the capacitance values of the capacitors C1a and C1b.

The switching capacitor generation circuit 12c (FIG. 1) has the same configuration as the switching capacitor generation circuit 12a except for the capacitance values of the capacitors C4a and C4b. The capacitance values of the capacitors C4a and C4b are set to be four times greater than the capacitance values of the capacitors C1a and C1b.

The operation of the switching capacitor generation circuits 12a to 12c will now be discussed.

First, the operation of the switching capacitor generation circuit 12a will be described. When the control signal Vcnt1 rises to an H level, the transistors T3, T4, and T5 are activated and the transistors T1 and T2 are deactivated.

Figure 3A:
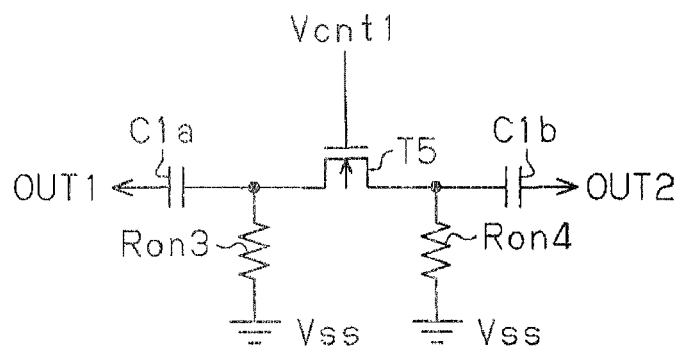
FIG. 3(a) is an equivalent circuit diagram showing the switching capacitor generation circuit of FIG. 2 in an active state.

FIG. 3(a) shows an equivalent circuit for such a state. As shown in the drawing, the drain terminal and the source terminal of the transistor T5 are coupled to the power supply Vss via the on-resistances Ron3 and Ron4 of the transistors T3 and T4, respectively. When the oscillator 2 is oscillated in this state, the activated transistor T5 acts as a switch element on the capacitors C1a and C1b, and the capacitors C1a and C1b act on the output terminals OUT1 and OUT2. This adjusts the frequency of the oscillation output signal output from the output terminals OUT1 and OUT2.

Figure 3B:
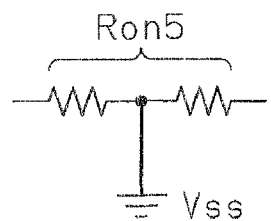
FIG. 3(b) is an equivalent circuit diagram showing the switching capacitor generation circuit of FIG. 2 in an active state.

In this case, the output voltages of the output terminal OUT1 and OUT2 alternately become high based on the oscillation output signal, and the transistor T5 performs a differential operation. Therefore, as shown in FIG. 3(b), a middle point of the on-resistance Ron5 of the transistor T5 forms a virtual power supply Vss. As a result, the on-resistance of the transistor T5 appears as Ron5/2 with respect to each of the output terminals OUT1 and OUT2 in the oscillator 2.

Figure 13:
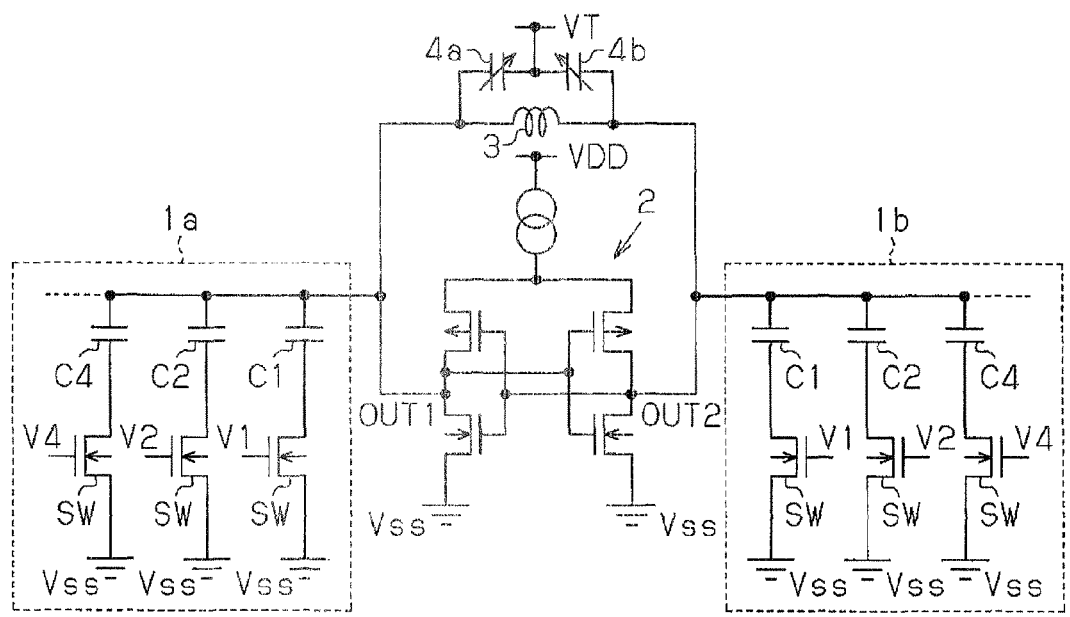
FIG. 13 is a circuit diagram showing a prior art VCO.
Figure 14:
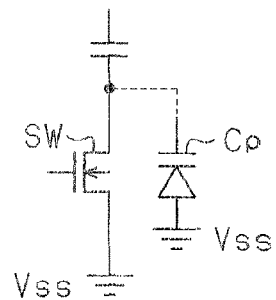
FIG. 14 is an equivalent circuit diagram showing a switching capacitor generation circuit of FIG. 13 in an inactive state.

Therefore, with respect to the on-resistance Ron5 of the transistor T5 that activates the capacitors C1a and C1b, the on-resistance of the transistor T5 for each of the capacitors C1a and C1b is equivalently set to Ron5/2. That is, the on-resistance of the switch element is reduced to substantially ½ in comparison with the prior art circuit of FIG. 13. Further, the activation of the transistors T3 and T4 biases each of the source terminal and drain terminal of the transistor T5 to the power supply Vss level. This ensures activation of the transistor T5.

Figure 4:
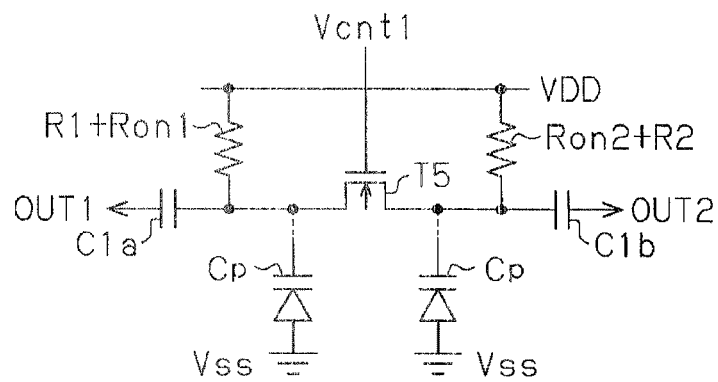
FIG. 4 is an equivalent circuit diagram showing the switching capacitor generation circuit of FIG. 2 in an inactive state.

When the control signal Vcnt1 falls to an L level, the transistors T1 and T2 are activated and the transistors T3, T4, and T5 are deactivated. As shown in FIG. 4, the source terminal and the drain terminal of the transistor T5 are coupled to the power supply VDD via the on-resistances Ron1 and Ron2 of the transistors T1 and T2 and the resistors R1 and R2, respectively.

In this state, due to the deactivation of the transistor T5, the capacitors C1a and C1b do not act on the output terminals OUT1 and OUT2 of the oscillator 2. Further, the source terminal and the drain terminal of the transistor T5 are biased to the power supply VDD via the on-resistances Ron1 and Ron2 and the resistors R1 and R2. Therefore, a deep reverse bias is applied between a substrate and the source terminal and drain terminal of the transistor T5. As a result, the parasitic capacitor Cp between the substrate and the source and drain terminals of the transistor T5 becomes small.

Furthermore, the source and drain terminals of the transistor T5 is biased to the power supply VDD level, and the control signal Vcnt1 provided to the gate has an L level. This ensures deactivation of the transistor T5.

The control signals Vcnt2 and Vcnt3 operate the switching capacitor generation circuits 12b and 12c in the same manner as the switching capacitor generation circuit 12a. In other words, the capacitors C2a and C2b act on the output terminals OUT1 and OUT2 of the oscillator 2 when the control signal Vcnt2 has an H level, and the capacitors C2a and C2b do not act on the output terminals OUT1 and OUT2 when the control signal Vcnt2 has an L level. Furthermore, the capacitors C4a and C4b act on the output terminals OUT1 and OUT2 of the oscillator 2 when the control signal Vcnt3 has an H level, and the capacitors C4a and C4b do not act on the output terminals OUT1 and OUT2 when the control signal Vcnt3 has an L level. Each of the transistors T1 to T5 of the switching capacitor generation circuits 12b and 12c operate in the same manner as the switching capacitor generation circuit 12a.

The VCO including the switching capacitor generation circuits 12a to 12c in the first embodiment has the advantages described below.

(1) The output signal frequency of the oscillator 2 is adjusted by selecting whether or not to activate each of the switching capacitor generation circuits 12a to 12c with the control signals Vcnt1 to Vcnt3 and changing the capacitance value that acts on the output terminals OUT1 and OUT2 of the oscillator 2.

(2) When activating the transistor T5, which is a switch element, of each switching capacitor generation circuit 12a to 12c so that the capacitors C1a, C1b, C2a, C2b, C4a, and C4b act on the output terminals OUT1 and OUT2 of the oscillator 2, the on-resistance value of the transistor T5 is equivalently reduced to ½. This substantially reduces the on-resistance value of the switch element (T5). Thus, the capacitor coupled to the output terminals OUT1 and OUT2 of the oscillator 2 is efficiently operated, and the quality factor is improved.

(3) When the transistor T5, which is the switch element, of each switching capacitor generation circuit 12a to 12c is deactivated, a junction capacitor is formed between the source terminal and drain terminal of the transistor T5 and the substrate, that is, a parasitic capacitor is formed in a deep reverse bias state. This allows for the parasitic capacitor of the transistor T5 in the deactivated state to be reduced in size and changes between a conductive state and a non-conductive state of the transistor T5 in the capacitance value that acts on the output terminal to be large.

(4) The single transistor T5 may select whether or not a pair of capacitors act on the output terminals OUT1 and OUT2 of the oscillator 2. Furthermore, the transistors T1 to T4 of each of the switching capacitor generation circuits 12a to 12c may be set to have the minimum size. This allows for reduction in the circuit area of the capacitor array 11.

Second Embodiment

FIGS. 5 to 11 show a switching capacitor generation circuit 21 in a second embodiment. In the switching capacitor generation circuit 21 of the second embodiment, the transistors T1 and T2 are controlled by a signal that differs from the control signals Vcnt1 to Vcnt3 to increase the on-resistance of the transistors T1 and T2 in each of the switching capacitor generation circuit 12a to 12c of the first embodiment.

Figure 5:
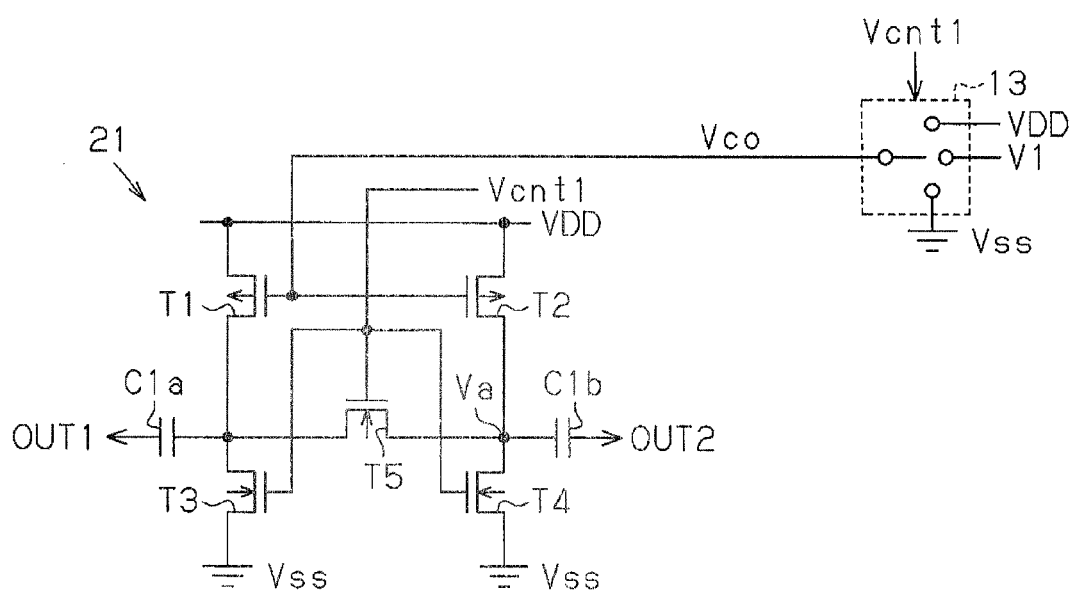
FIG. 5 is a circuit diagram showing a switching capacitor generation circuit in a second embodiment.

Furthermore, in the switching capacitor generation circuit 21 shown in FIG. 5, the resistors R1 and R2 are omitted from the switching capacitor generation circuits 12a to 12c of the first embodiment. Parts that are the same as the first embodiment will be given the same reference numbers.

The control signal Vcnt1 is provided to the gates of the transistors T3 to T5 in the same manner as the first embodiment. A control voltage Vco is supplied to the gates of the transistors T1 and T2 from a control voltage selection circuit 13.

In response to the control signal Vcnt1, the control voltage selection circuit 13 selects as the control voltage Vco one of the high potential power supply VDD, the lower potential power supply Vss, and the bias voltage V1 for maintaining the transistors T1 and T2 in a high resistance state when the transistors T1 and T2 are activated.

Figure 6:
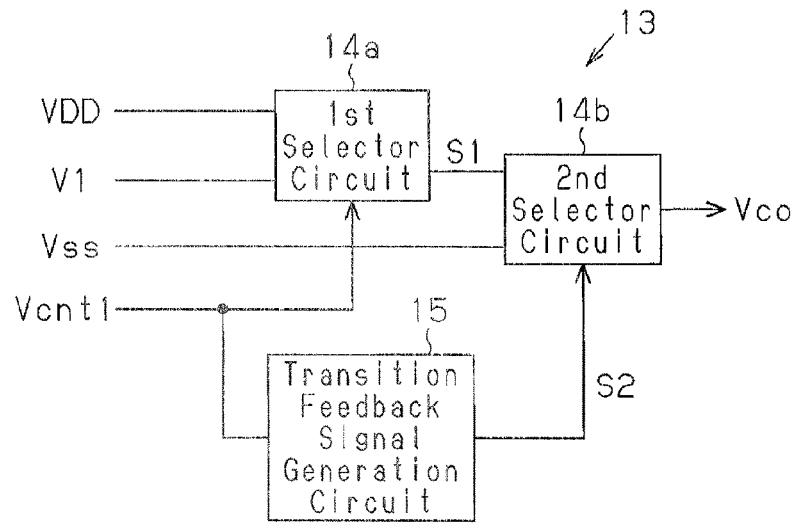
FIG. 6 is a block diagram showing a control voltage selection circuit of FIG. 5.
Figure 9:
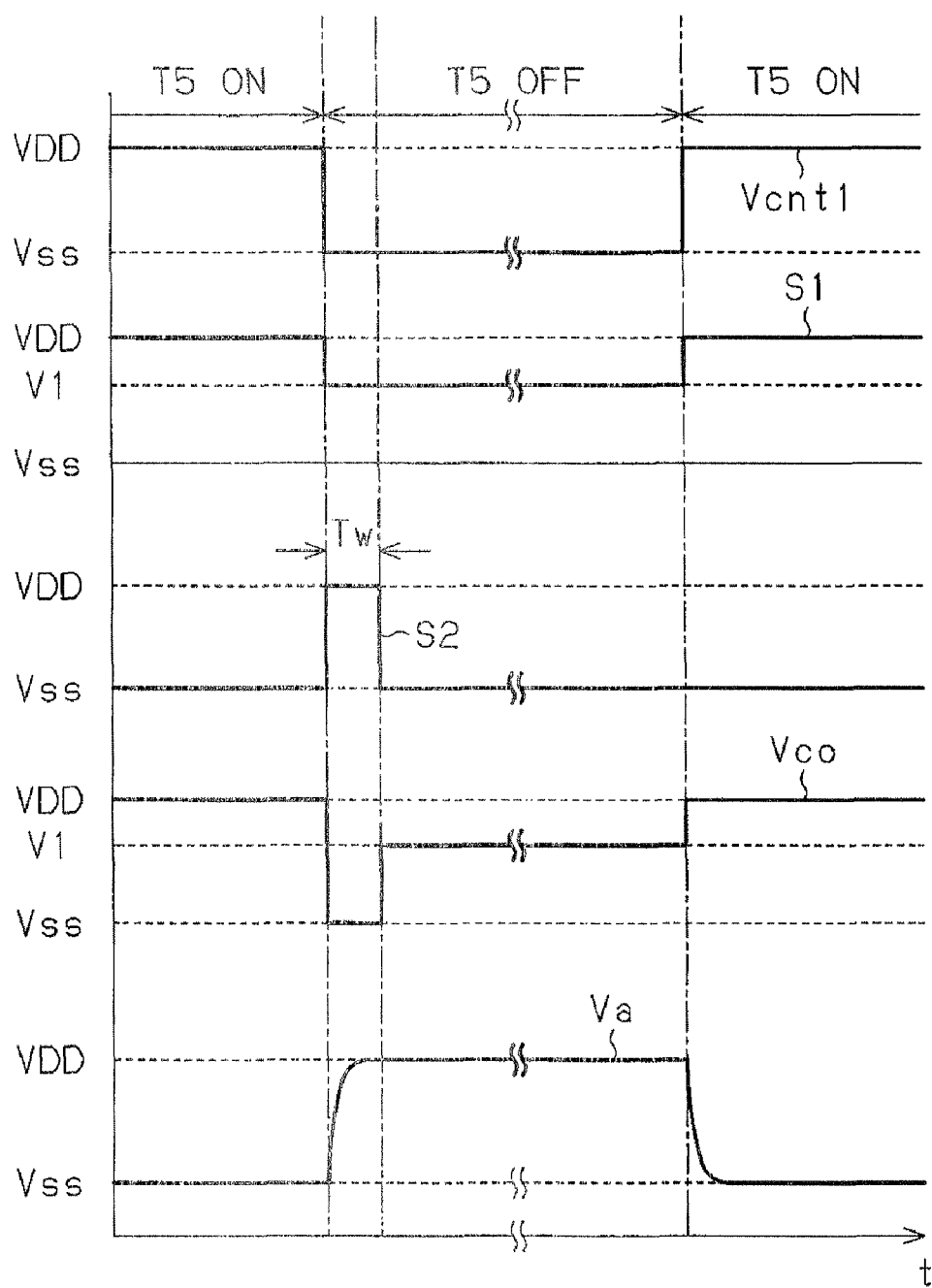
FIG. 9 is a timing waveform chart showing the operation of the switching capacitor generation circuit of FIG. 5.

FIG. 6 shows the configuration of the control voltage selection circuit 13 in detail. The power supply VDD and the bias voltage V1 are supplied to a first selector circuit 14a. As shown in FIG. 9, the bias voltage V1 is set to a voltage that is slightly higher than a median potential of the power supply VDD and the power supply Vss.

Furthermore, the control signal Vcnt1 is provided to the first selector circuit 14a as a first selection signal. The first selector circuit 14a outputs voltage having the power supply VDD level as an output signal S1 when the control signal Vcnt1 has an H level and outputs the bias voltage V1 as the output signal S1 when the control signal Vcnt1 has an L level.

The output signal S1 of the first selector circuit 14a and the power supply Vss are provided to a second selector circuit 14b. An output signal S2 of a transition feedback signal generation circuit 15 is also provided to the second selector circuit 14b as a second selection signal (transition period signal). The second selector circuit 14b outputs the output signal S1 of the first selector circuit 14a as the control voltage Vco when the output signal S2 of the transition feedback signal generation circuit 15 has an L level and outputs voltage having the power supply Vss level as the control voltage Vco when the output signal S2 of the transition feedback signal generation circuit 15 has an H level.

The control signal Vcnt1 is provided to the transition feedback signal generation circuit 15. As shown in FIG. 9, the transition feedback signal generation circuit 15 raises the output signal S2 when the control signal Vcnt1 falls and maintains the output signal S2 at an H level during a time restricted to the transition period Tw.

Figure 7:
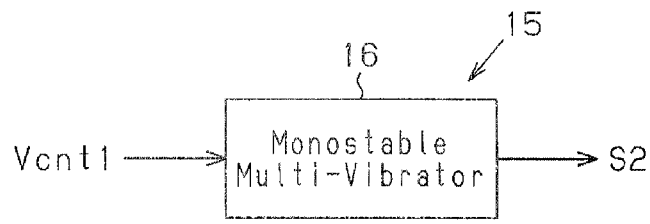
FIG. 7 is a block diagram showing a transition period signal generation circuit of FIG. 6.

FIG. 7 shows an example of the transition feedback signal generation circuit 15. As shown in the drawing, the transition feedback signal generation circuit 15 may be configured by a monostable multi-vibrator 16 that maintains the output signal S2 at an H level during the transition period Tw when the control signal Vcnt1 falls.

Figure 8:
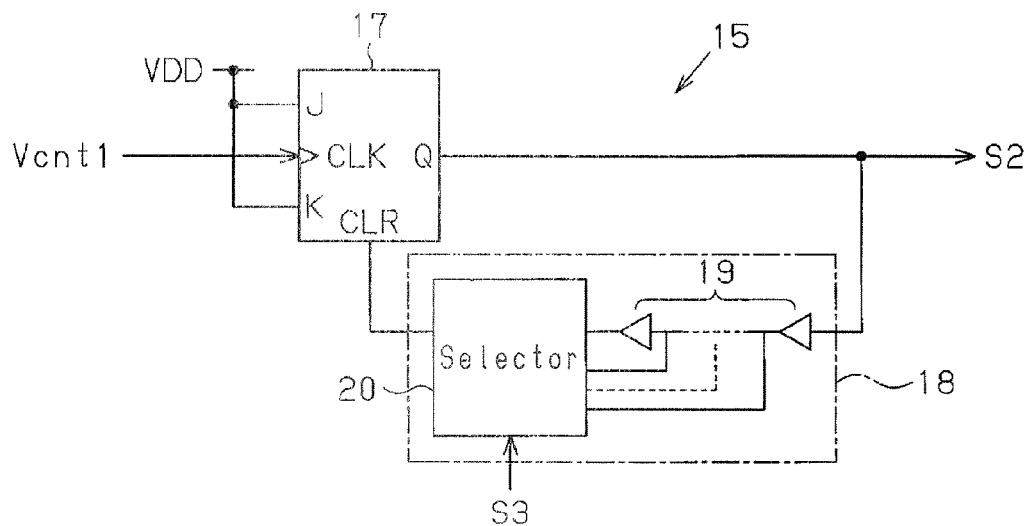
FIG. 8 is a circuit diagram showing the transition period signal generation circuit of FIG. 6.

FIG. 8 shows another example of the transition feedback signal generation circuit 15. In the circuit 15 shown in the drawing, the control signal Vcnt1 is input to a clock terminal CLK of a flip-flop circuit 17, the power supply VDD is input to a J input terminal and a K input terminal, and the output signal S2 is output from an output terminal Q.

The output signal S2 is provided to a delay time setting unit 18. The output signal of the delay time setting unit 18 is input to a clear terminal CLR of the flip-flop circuit 17.

The delay time setting unit 18 includes plural stages of buffer circuits 19, which are coupled in series, and a selector 20. The output signal S2 is provided to the initial stage of the buffer circuit 19, and the output signal of each buffer circuit 19 is provided to the selector 20.

A selection signal S3 is provided to the selector 20, and the selector 20 selects one of the output signals of the buffer circuits 19 in accordance with the selection signal S3.

In such a configuration, the output signal S2 rises from the L level to the H level when the control signal Vcnt1 falls from the H level to the L level. When the output signal of the buffer circuit 19 selected by the selector 20 is input to the clear terminal CLR of the flip-flop circuit 17, the output signal S2 falls to the L level. This sets the transition period Tw of the output signal S2 with the delay time selected by the delay time setting unit 18.

Figure 10:
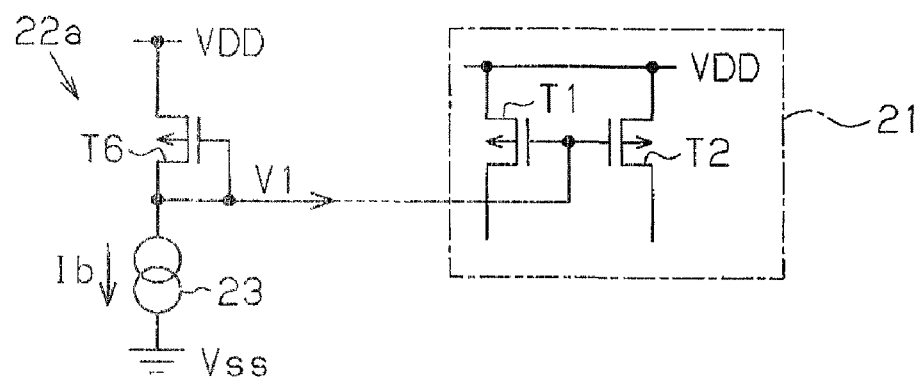
FIG. 10 is a circuit diagram showing a bias voltage generation circuit in one example.
Figure 11:
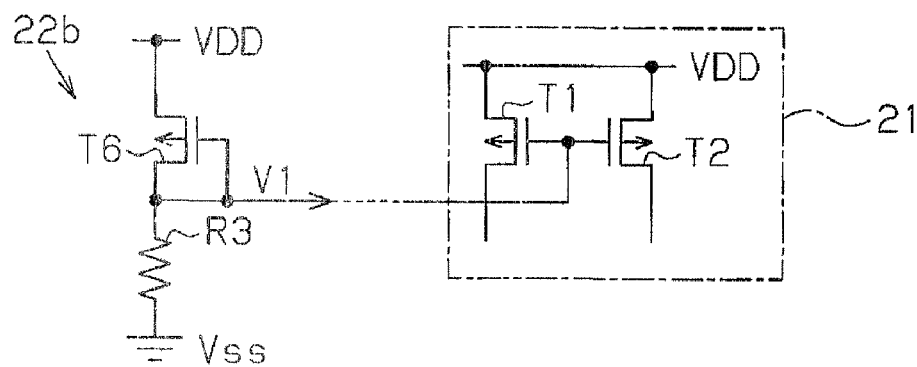
FIG. 11 is a circuit diagram showing another bias voltage generation circuit.

FIGS. 10 and 11 show a bias voltage generation circuit for generating the bias voltage V1. In a bias voltage generation circuit 22a shown in FIG. 10, the power supply VDD is coupled to a source of a P-channel MOS transistor T6, and a current source 23 is coupled between the power supply Vss and the gate and drain of the transistor T6. The bias voltage V1 is generated in accordance with a bias current Ib flowing to the current source 23, and the bias voltage V1 is output from the gate of the transistor T6.

When the bias voltage V1 is selected as the control signal Vco by the control voltage selection circuit 13, the gate of the transistor T6 is coupled to the gates of the transistors T1 and T2 of the switching capacitor generation circuit 21.

Since the transistor T6 and the transistors T1 and T2 perform a current mirror operation, the on-resistances of the transistors T1 and T2 may be set to the desired high resistance by adjusting the bias current Ib and adjusting the bias voltage V1.

In a bias voltage generation circuit 22b shown in FIG. 11, the current source 23 of the bias voltage generation circuit 22a is replaced with a resistor R3. The on-resistances of the transistors T1 and T2 can be set to the desired high resistance by adjusting the resistance value of the resistor R3.

The resistor R3 may be an externally attached resistor arranged outside a chip and including the VCO to ensure accuracy and facilitate adjustment.

The control voltage selection circuit 13 is arranged in each of a plurality of the switching capacitor generation circuits 21 that form a capacitor array.

The operation of the switching capacitor generation circuit 21 will now be described with reference to FIG. 9. The transistors T3 to T5 are activated when the control signal Vcnt1 has an H level. In the control voltage selection circuit 13, the output signal S1 of the first selector circuit 14a is set to the power supply VDD level, and the output signal S2 of the second selector circuit 14b is set to the power supply Vss level.

As a result, the control voltage Vco output from the second selector circuit 14b is set to the power supply VDD level. Accordingly, the transistors T1 and T2 are deactivated. Thus, the operation becomes similar to the first embodiment.

When the control signal Vcnt1 falls from the H level to the L level, the first selector circuit 14a sets the output signal S1 to the bias voltage V1. Further, the output signal S2 of the transition period signal generation circuit 15 is maintained at the H level during the transition period Tw and thereafter falls to the L level.

The control voltage Vco output from the second selector circuit 14b is maintained at the power supply Vss level during the transition period Tw and then set to the bias voltage V1.

Such an operation deactivates the transistors T3 to T5 when the control signal Vcnt1 falls. Further, the gates of the transistors T1 and T2 are supplied with the power supply Vss level in the transition period Tw. Therefore, the on-resistances of the transistors T1 and T2 are small, and the node Va, which is the source terminal or drain terminal of the transistor T5, is readily raised from the power supply Vss level to the power supply VDD level.

After the transition period Tw, the bias voltage V1 is supplied to the gates of the transistors T1 and T2 so that the transistors T1 and T2 are activated in the high resistance state. In this state, the operation is similar to the switching capacitor generation circuits 12a to 12c of the first embodiment.

When the control signal Vcnt1 returns to the H level, the transistors T1 and T2 are deactivated, the transistors T3 to T5 are activated, and the node Va is lowered to the power supply Vss level.

In addition to advantages (1) to (4) of the first embodiment, the switching capacitor generation circuit 21 of the second embodiment has the advantages described below.

(5) When the transistors T1 and T2 of the switching capacitor generation circuit 21 are activated and the transistors T3 to T5 are deactivated, the transistors T1 and T2 are activated in a high resistance state by the bias voltage V1. Therefore, the resistors R1 and R2 required in the switching capacitor generation circuits 12a to 12c of the first embodiment may be omitted to reduce the circuit area.

(6) When the control signal Vcnt1 falls from the H level to the L level, the transistors T1 and T2 are activated, and the transistors T3 to T5 are deactivated, the control voltage Vco is maintained at the power supply Vss level in the transition period Tw. Therefore, the node Va is readily pulled up to the power supply VDD level, and the transistor T5 is deactivated. As a result, the capacitor that acts on the output terminals OUT1 and OUT2 of the oscillator 2 is readily switched. This increases the speed for switching the frequency of the output signal of the oscillator 2.

Third Embodiment

Figure 12:
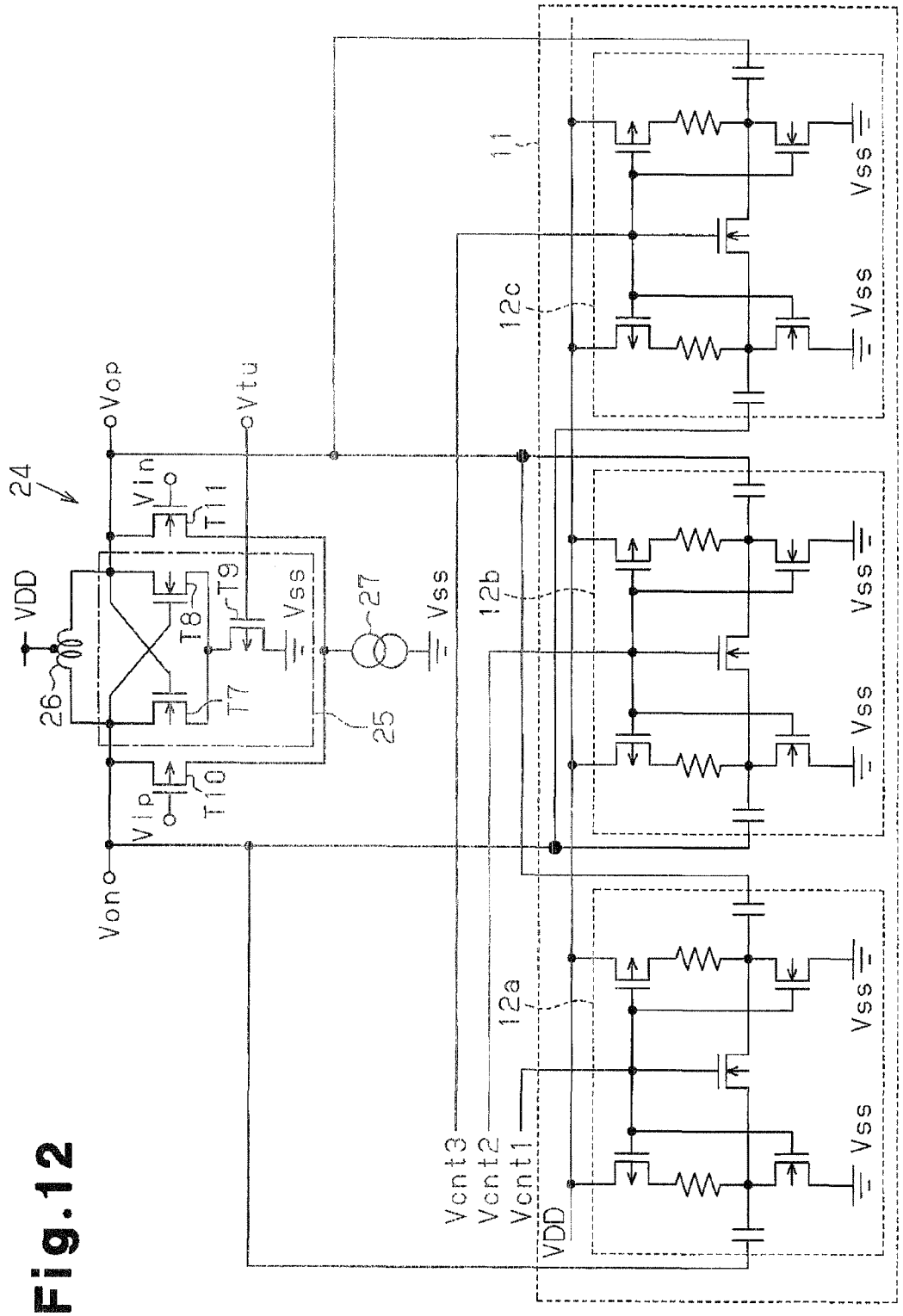
FIG. 12 is a circuit diagram showing an LC band pass filter in a third embodiment.

FIG. 12 shows a third embodiment. In the third embodiment, the capacitor array 11 of the first embodiment is coupled to an LC band pass filter, and the center frequency of the LC resonance frequency is adjusted by the capacitor array 11.

An LC resonator 24 of the LC band filter has a known configuration. A negative resistance generation unit 25 is configured by N-channel MOS transistors T7 and T8 and a P-channel MOS transistor T9.

The gate of the transistor T7 is coupled to the drain of the transistor T8, and the gate of the transistor T8 is coupled to the drain of the transistor T7. The transistor T9 is arranged between the sources of the transistors T7 and T8 and the power supply Vss. A tuning voltage Vtu is input to the gate of the transistor T9.

An inductance 26 is coupled between the drains of the transistors T7 and T8. The power supply VDD is supplied to a median point of the inductance 26. The source of a P-channel MOS transistor T10 is coupled to the drain of the transistor T7, and a drain of an N-channel MOS transistor T11 is coupled to the drain of the transistor T8. The drain of the transistor T10 and the source of the transistor T11 are coupled to the power supply Vss via a current source 27.

An input signal Vip is input to the gate of the transistor T10, and an input signal Vin is input to the gate of the transistor T11. The input signals Vip and Vin are complementary oscillation signals.

The switching capacitor generation circuits 12a to 12c of the capacitor array 11 are coupled to the drains of the transistors T7 and T8. The output signals Von and Vop are output from the drains of the transistors T7 and T8.

The LC band pass filter generates the output signals Von and Vop in which the desired frequency is separated from the frequencies of the input signals Vip and Vin by the LC resonance frequency corresponding to the capacitance values of the inductance 26 and the capacitor array 11.

The center frequency of the LC resonance frequency is adjusted by selectively coupling the switching capacitor generation circuits 12a to 12c of the capacitor array 11 to the drains of the transistors T7 and T8 with the control signals Vcnt1 to Vcnt3.

The Q (attenuation rate) of the output signals Von and Vop is adjustable by adjusting the tuning voltage Vtu. The Q of the output signals Von and Vop may be improved in a state in which the tuning voltage Vtu is lowered, that is, while reducing the drain current of the transistor T9.

Each of the above-described embodiments may be practiced in the forms described below.

One of the transistors T3 and T4 shown in FIG. 2 may be omitted, and the source terminal and drain terminal of the transistor T5 may be biased to the low potential power supply voltage using one N-channel MOS transistor.

One of the transistors T1 and T2 shown in FIG. 2 may be omitted, and the source terminal and drain terminal of the transistor T5 may be biased to the high potential power supply voltage using one P-channel MOS transistor. In this case, only one of the resistors R1 and R2 shown in FIG. 2 is required.

Each switching capacitor generation circuit 12a, 12b, and 12c shown in FIG. 12 may be replaced by the switching capacitor generation circuits 21, 21, and 21 shown in FIG. 5.

The invention claimed is:

1. A switching capacitor generation circuit including first and second output terminals, the switching capacitor generation circuit comprising:
    a first capacitor coupled to the first output terminal;
    a second capacitor coupled to the second output terminal;
    a single switch element comprising a first terminal coupled to the first capacitor and a second terminal coupled to the second capacitor;
    a first bias element which biases the first terminal and the second terminal to a high potential power supply voltage when the single switch element is deactivated; and
    a second bias element which biases the first terminal and the second terminal to a low potential power supply voltage when the single switch element is activated.

2. The switching capacitor generation circuit according to claim 1, wherein the switch element includes a first N-channel MOS transistor having the first terminal and the second terminal,
    wherein the second bias element biases the first terminal and the second terminal of the first N-channel MOS transistor to the low potential power supply voltage when the first N-channel MOS transistor is activated, and
    wherein the first bias element biases the first terminal and the second terminal of the first N-channel MOS transistor to the high potential power supply voltage when the first N-channel MOS transistor is deactivated.

3. The switching capacitor generation circuit according to claim 2, wherein:
    the first bias element includes a second N-channel MOS transistor;
    the second bias element includes a first P-channel MOS transistor; and
    the switch element and the first bias element are responsive to a common control signal.

4. The switching capacitor generation circuit according to claim 3, wherein the second bias element is further responsive to the control signal.

5. The switching capacitor generation circuit according to claim 4, further comprising:
    a resistor coupled in series to the second bias element.

6. The switching capacitor generation circuit according to claim 3, further comprising:
    a control voltage selection circuit which supplies a bias voltage to the second bias element to activate the second bias element in a high resistance state when the switch element and the first bias element are deactivated.

7. The switching capacitor generation circuit according to claim 6, wherein the control voltage selection circuit includes a first selector circuit which supplies the high potential power supply voltage to the second bias element when the switch element and the first bias element are activated and supplies the bias voltage to the second bias element when the switch element and the first bias element are deactivated.

8. The switching capacitor generation circuit according to claim 7, wherein the control voltage selection circuit further includes:
    a transition period signal generation circuit which generates a transition period signal when the control signal falls; and
    a second selector circuit which supplies the low potential power supply voltage to the second bias element using the transition period signal.

9. The switching capacitor generation circuit according to claim 8, wherein the transition period signal generation circuit includes a monostable multi-vibrator which receives the control signal.

10. The switching capacitor generation circuit according to claim 8, wherein the transition period signal generation circuit includes:
    a flip-flop circuit which generates an output signal in response to the control signal; and
    a delay time setting unit which delays the output signal of the flip-flop circuit and provides the flip-flop circuit with the delayed output signal as a clear signal.

11. The switching capacitor generation circuit according to claim 6, further comprising:
    a bias voltage generation circuit which supplies the bias voltage to the control voltage selection circuit, wherein the bias voltage generation circuit includes:
        a second P-channel MOS transistor which performs a current mirror operation with the second bias element; and
        a current source which is coupled to the second P-channel MOS transistor, the bias voltage being output from a node between the second P-channel MOS transistor and the current source.

12. The switching capacitor generation circuit according to claim 6, further comprising:
    a bias voltage generation circuit which supplies the bias voltage to the control voltage selection circuit, wherein the bias voltage generation circuit includes:
        a second P-channel MOS transistor which performs a current mirror operation with the second bias element; and
        a resistor coupled to the second P-channel MOS transistor, the bias voltage being output from a node between the second P-channel MOS transistor and the resistor.

13. A switching capacitor generation circuit including first and second output terminals, the switching capacitor generation circuit comprising:
- a first capacitor coupled to the first output terminal;
- a second capacitor coupled to the second output terminal;
- a first transistor of a first conductivity type having a first terminal coupled to the first capacitor, a second terminal coupled to the second capacitor, and a first control terminal;
- a second transistor of the first conductivity type, the second transistor having a third terminal coupled to the first terminal of the first transistor, a fourth terminal coupled to a low potential power supply, and a second control terminal coupled to the first control terminal of the first transistor;
- a third transistor of the first conductivity type, the third transistor having a fifth terminal coupled to the second terminal of the first transistor, a sixth terminal coupled to the low potential power supply, and a third control terminal coupled to the first control terminal of the first transistor;
- a fourth transistor of a second conductivity type, the fourth transistor having a seventh terminal, an eighth terminal coupled to a high potential power supply, and a fourth control terminal coupled to the first control terminal of the first transistor;
- a fifth transistor of the second conductivity type, the fifth transistor having a ninth terminal, a tenth terminal coupled to the high potential power supply, and a fifth control terminal coupled to the first control terminal of the first transistor;
- a first resistor coupled between the second transistor and the fourth transistor; and
- a second resistor coupled between the third transistor and the fifth transistor.

14. A switching capacitor generation circuit including first and second output terminals, the switching capacitor generation circuit comprising:
- a first capacitor coupled, to the first output terminal;
- a second capacitor coupled to the second output terminal;
- a first transistor of a first conductivity type having a first terminal coupled to the first capacitor, a second terminal coupled to the second capacitor, and a first control terminal;
- a second transistor of the first conductivity type, the second transistor having a third terminal coupled to the first terminal of the first transistor, a fourth terminal coupled to a low potential power supply, and a second control terminal coupled to the first control terminal of the first transistor;
- a third transistor of the first conductivity type, the third transistor having a fifth terminal coupled to the second terminal of the first transistor, a sixth terminal coupled to the low potential power supply, and a third control terminal coupled to the first control terminal of the first transistor;
- a fourth transistor of a second conductivity type, the fourth transistor having a seventh terminal coupled to the third terminal of the second transistor, an eighth terminal coupled to a high potential power supply, and a fourth control terminal; and
- a fifth transistor of the second conductivity type, the fifth transistor having a ninth terminal coupled to the fifth terminal of the third transistor, a tenth terminal coupled to the high potential power supply, and a fifth control terminal coupled to the fourth control terminal of the fourth transistor.

15. A voltage-controlled oscillator comprising:
- an LC oscillation circuit; and
- a plurality of switching capacitor generation circuits coupled to the LC oscillation circuit, each of the switching capacitor generation circuits being formed by the switching capacitor generation circuit according to claim 1.

16. An LC band pass filter comprising:
- an LC resonance circuit; and
- a plurality of switching capacitor generation circuits coupled to the LC resonance circuit, each of the switching capacitor generation circuits being formed by the switching capacitor generation circuit according to claim 1.

17. The switching capacitor generation circuit according to claim 7, further comprising:
- a bias voltage generation circuit which supplies the bias voltage to the control voltage selection circuit, wherein the bias voltage generation circuit includes:
  - a second P-channel MOS transistor which performs a current mirror operation with the second bias element; and
  - a current source which is coupled to the second P-channel MOS transistor, the bias voltage being output from a node between the second P-channel MOS transistor and the current source.

18. The switching capacitor generation circuit according to claim 8, further comprising:
- a bias voltage generation circuit which supplies the bias voltage to the control voltage selection circuit, wherein the bias voltage generation circuit includes:
  - a second P-channel MOS transistor which performs a current mirror operation with the second bias element; and
  - a current source which is coupled to the second P-channel MOS transistor, the bias voltage being output from a node between the second P-channel MOS transistor and the current source.

19. The switching capacitor generation circuit according to claim 7, further comprising:
- a bias voltage generation circuit which supplies the bias voltage to the control voltage selection circuit, wherein the bias voltage generation circuit includes:
  - a second P-channel MOS transistor which performs a current mirror operation with the second bias element; and
  - a resistor coupled to the second P-channel MOS transistor, the bias voltage being output from a node between the second P-channel MOS transistor and the resistor.

20. The switching capacitor generation circuit according to claim 8, further comprising:
- a bias voltage generation circuit which supplies the bias voltage to the control voltage selection circuit, wherein the bias voltage generation circuit includes:
  - a second P-channel MOS transistor which performs a current mirror operation with the second bias element; and
  - a resistor coupled to the second P-channel MOS transistor, the bias voltage being output from a node between the second P-channel MOS transistor and the resistor.

* * * * *